US009646976B2

(12) United States Patent
Sun

(10) Patent No.: US 9,646,976 B2
(45) Date of Patent: May 9, 2017

(54) FERROELECTRIC RANDOM-ACCESS MEMORY WITH PRE-PATTERNED OXYGEN BARRIER

(71) Applicant: Cypress Semiconductor Corporation, San Jose, CA (US)

(72) Inventor: Shan Sun, Monument, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/970,063

(22) Filed: Dec. 15, 2015

(65) Prior Publication Data
US 2016/0351577 A1    Dec. 1, 2016

Related U.S. Application Data

(63) Continuation of application No. 14/738,492, filed on Jun. 12, 2015, now Pat. No. 9,305,995.

(60) Provisional application No. 62/169,042, filed on Jun. 1, 2015.

(51) Int. Cl.
*H01L 21/00* (2006.01)
*H01L 27/11507* (2017.01)
*H01L 49/02* (2006.01)

(52) U.S. Cl.
CPC ........ *H01L 27/11507* (2013.01); *H01L 28/55* (2013.01); *H01L 28/56* (2013.01); *H01L 28/57* (2013.01); *H01L 28/75* (2013.01)

(58) Field of Classification Search
CPC ......... H01L 2924/00; H01L 2924/0002; H01L 2924/00014; H01L 23/53238; H01L 21/76843; H01L 21/76834; H01L 21/76846; H01L 21/76849;
(Continued)

(56) References Cited

U.S. PATENT DOCUMENTS 6,180,974 B1    1/2001  Okutoh et al.
6,627,931 B1    9/2003  Casagrande et al.
6,656,748 B2   12/2003  Hall et al.
(Continued)

OTHER PUBLICATIONS

Kazushi Amanuma, et al., "Capacitor-on-metal/via-stacked-plug (CMVP) memory cell for 0.25 μm CMOS embedded FeRAM", Electron Devices Meeting, Dec. 1998.
(Continued)

*Primary Examiner* — Robert Bachner

(57) ABSTRACT

Structure of F-RAM cells are described. The F-RAM cell include a contact extending through a first dielectric layer on a surface of a substrate. A barrier structure is formed over the contact by depositing and patterning a barrier layer. A second dielectric layer is deposited over the patterned barrier layer and planarized to expose a top surface of the barrier structure. A ferro-stack is deposited and patterned over the barrier structure to form a ferroelectric capacitor. A bottom electrode of the ferroelectric capacitor is electrically coupled to the diffusion region of the MOS transistor through the barrier structure. The barrier layer is conductive so that a bottom electrode of the ferroelectric capacitor is electrically coupled to the contact through the barrier structure. In one embodiment, patterning barrier layer comprises concurrently forming a local interconnect (LI) on a top surface of the first dielectric layer.

20 Claims, 17 Drawing Sheets

(58) Field of Classification Search
CPC ..... H01L 21/76867; H01L 2224/05686; H01L 23/53295; H01L 2924/12042
See application file for complete search history.

(56) References Cited

U.S. PATENT DOCUMENTS

| | | |
|---|---|---|
| 6,773,986 B2 | 8/2004 | Bruchhaus et al. |
| 6,893,912 B2 | 5/2005 | Lung |
| 6,914,282 B2 | 7/2005 | Lung |
| 7,745,863 B2 | 6/2010 | Adkisson et al. |
| 8,518,792 B2 | 8/2013 | Sun et al. |
| 8,552,515 B2 | 10/2013 | Sun et al. |
| 2010/0187584 A1* | 7/2010 | Matsuda ........... H01L 27/11507 257/295 |
| 2015/0004718 A1* | 1/2015 | Sun .................. H01L 27/11507 438/3 |

OTHER PUBLICATIONS

L. Trupina et al., Iridium layer as oxygen barrier and growth substrate for oriented PZT thin films, Journal of Optoelectronics and Advanced Materials vol. 9, No. 5, May 2007, p. 1508-1510.

Nec Develops Technology for 0.25-micron CMOS Logic Embedded FeRAM Memory Cell, NEC website: http://www.nec.co.jp/press/en/9812/0701.html, published Dec. 7, 1998.

USPTO Notice of Allowance for U.S. Appl. No. 14/738,492 dated Aug. 26, 2015; 7 pages.

USPTO Notice of Allowance for U.S. Appl. No. 14/738,492 dated Dec. 11, 2015; 7 pages.

\* cited by examiner

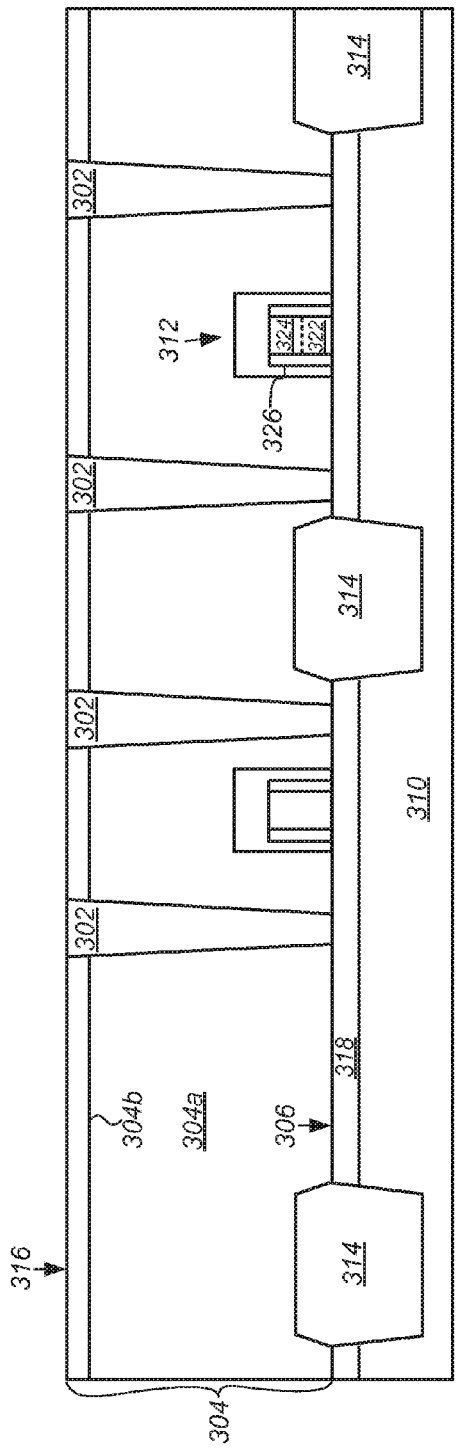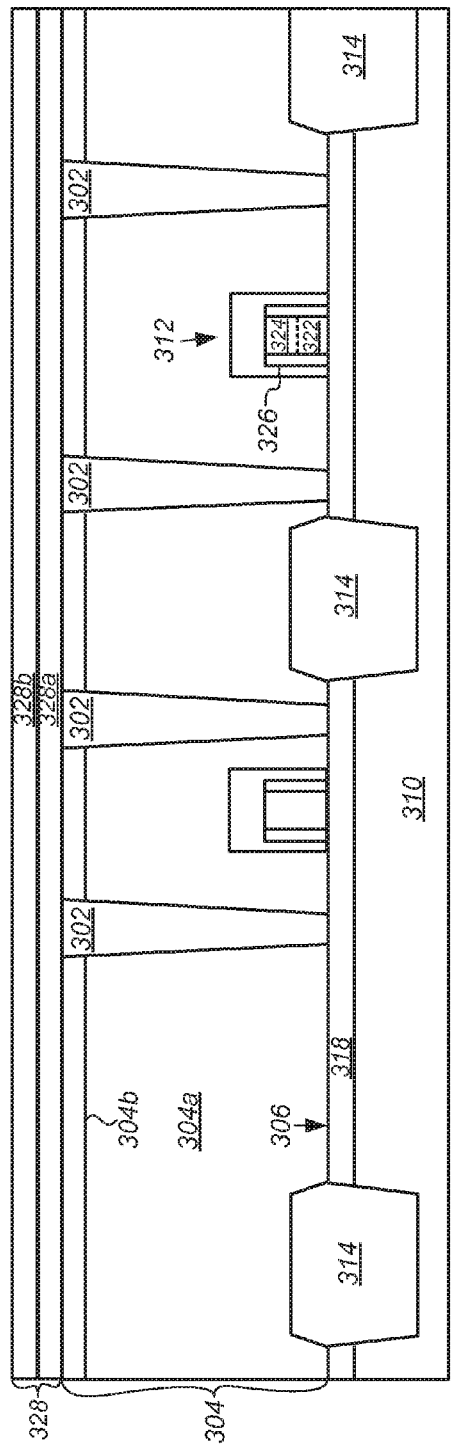
FIG. 3A
FIG. 3B

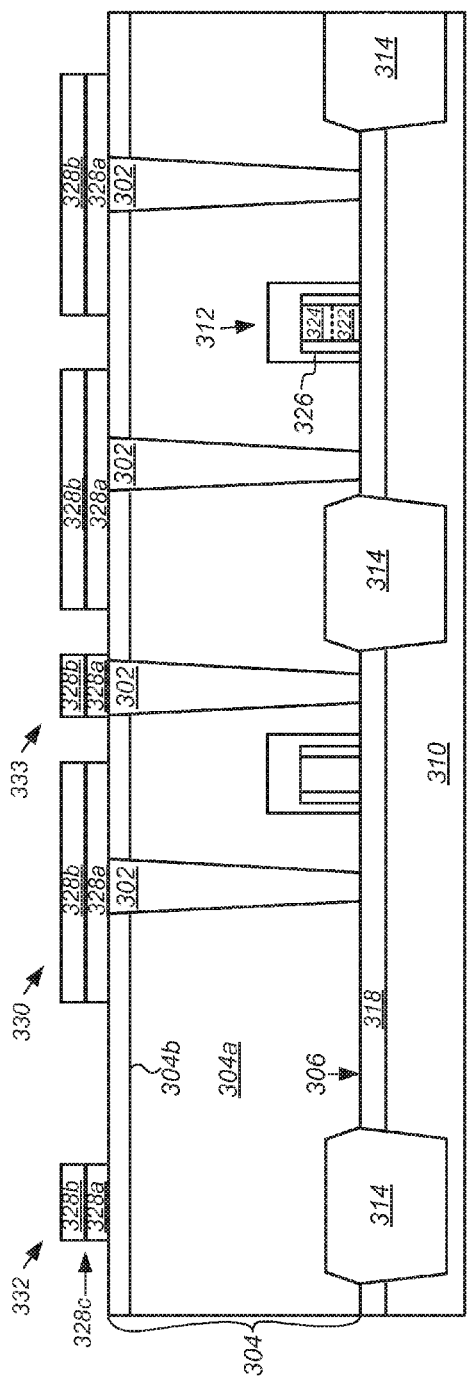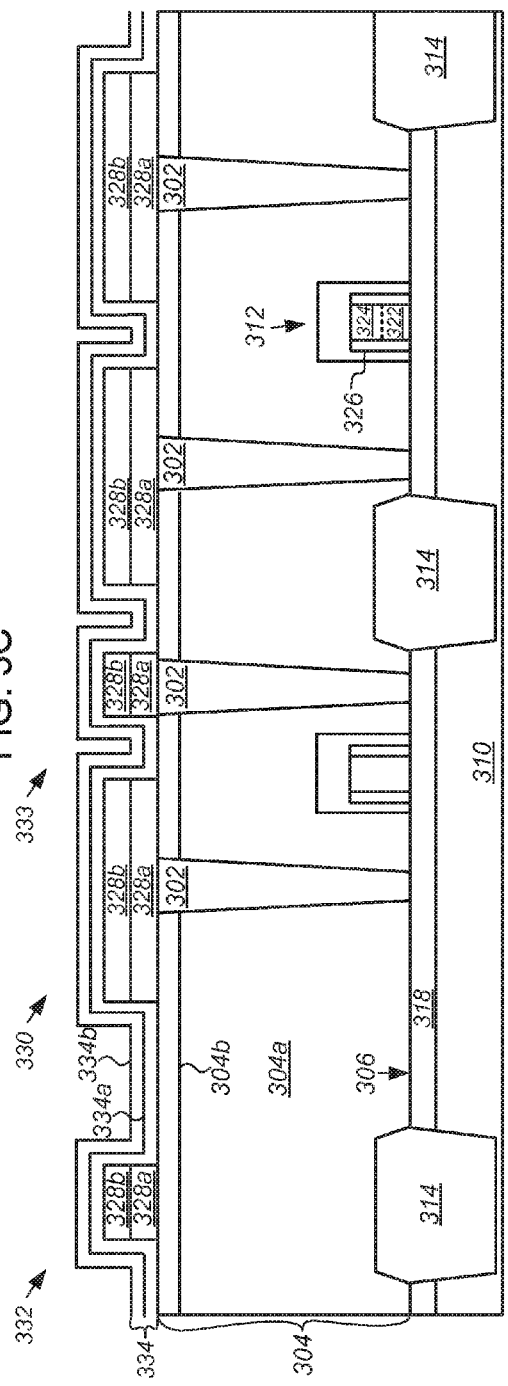

FERROELECTRIC RANDOM-ACCESS MEMORY WITH PRE-PATTERNED OXYGEN BARRIER

CROSS-REFERENCE TO RELATED APPLICATIONS

This application is Continuation application of and claims the benefit of priority to U.S. NonProvisonal patent application Ser. No. 14/738,492, filed Jun. 12, 2015, which claims the benefit of priority under 35 U.S.C. 119(e) to U.S. Provisional Patent Application Ser. No. 62/169,042, filed Jun. 1, 2015, which are both incorporated by reference herein in each of their entirety.

TECHNICAL FIELD

The present disclosure relates generally to semiconductor devices, and more particularly to ferroelectric random access memories (F-RAM) including embedded or integrally formed ferroelectric capacitors and complementary metal-oxide-semiconductor (CMOS) transistors and methods for fabricating the same.

BACKGROUND

Ferroelectric random-access memories (F-RAM) typically include a grid or an array of storage elements or cells, each including at least one ferroelectric capacitor and one or more associated transistors to select the cell and control reading or writing thereto.

When an external electric field is applied across a ferroelectric material of a ferroelectric capacitor in the cell, dipoles in the material align with the field direction. After the electric field is removed, the dipoles retain their polarization state. Data is stored in the cells as one of two possible electric polarizations in each data storage cell. For example, in a one transistor-one capacitor (1T1C) cell, a "1" may be encoded using a negative remnant polarization, and a "0" is encoded using a positive remnant polarization.

FIG. 1 illustrates a cross-sectional view of a portion of a F-RAM cell 100 fabricated according to a conventional method. Referring to FIG. 1, the ferroelectric capacitor 102 in an F-RAM cell typically includes a ferroelectric material 104 between an upper electrode 106 and a lower electrode 108. Transistors 110 in the cell 100 are typically metal-oxide-semiconductor (MOS) transistors fabricated on a substrate 112 using a standard or baseline complimentary-metal-oxide-semiconductor (CMOS) process flows, involving the formation and patterning of conducting, semi-conducting, dielectric and materials. The composition of these materials, as well as the composition and concentration of processing reagents, and temperature used in such a CMOS process flow are stringently controlled for each operation to ensure the resultant MOS transistors will function properly. Thus, in conventional methods of fabricating F-RAM the ferroelectric capacitor 102 is fabricated in a separate F-RAM layer 114 overlying a CMOS layer 116 in which the MOS transistors 110 are fabricated and connected thereto by one or more contacts 118 extending to a diffusion region 120 of the MOS transistor in the substrate 112 and/or by a separate wiring layer 122 fabricated in yet another dielectric layer 124 overlying the F-RAM layer 112 and connected to the MOS transistors and ferroelectric capacitor through additional contacts 126.

Materials and processes typically used to fabricate the CMOS transistors 110, contacts 118 and wiring layer 122 are incompatible with ferroelectric capacitor process flow, and can detrimentally impact their performance. In particular, when fabricating the ferroelectric capacitor 102 over a contact 118 in the CMOS layer 116 processes used to fabricate the ferroelectric capacitor can oxidize a metal used in the contact. Thus, ferroelectric capacitors 102 formed over such contacts 118 typically must include an oxygen barrier 128 between the contact and bottom electrode.

It will be understood by those skilled in the art that the above described conventional method of fabricating F-RAM undesirably increases an aspect ratio of the ferroelectric capacitors 102, as well as the overall size or height of the F-RAM cell 100, and require several extra mask and processing steps, all of which increase fabrication time, costs, and defect density lowering a yield of working memories.

SUMMARY

Non-volatile memory cells including complimentary metal-oxide-semiconductor (CMOS) transistors and embedded ferroelectric capacitors formed according to methods of the present disclosure minimizes changes to the CMOS process flow, reducing cost of fabricating ferroelectric random access memories (F-RAM), lowering defect density and enabling tighter design rules.

In one embodiment, the method includes forming a contact extending through a first dielectric layer on a surface of a substrate. A barrier structure is formed over the contact. Generally, forming the barrier structure includes: (i) depositing a barrier layer over a top surface of the first dielectric layer and the contact; (ii) patterning the barrier layer to form the barrier structure over the contact; (iii) depositing a second dielectric layer over the patterned barrier layer and the first dielectric layer, and (iv) planarizing the second dielectric layer to expose a top surface of the barrier structure. A ferro-stack is deposited over the barrier structure. The ferro-stack includes a bottom electrode layer deposited on the barrier structure, a ferroelectric layer on the bottom electrode layer and a top electrode on the ferroelectric layer. Finally, the ferro-stack is patterned to form a ferroelectric capacitor over the barrier structure, wherein the barrier layer is conductive and a bottom electrode of the ferroelectric capacitor is electrically coupled to the contact through the barrier structure.

In one embodiment, forming the barrier structure further includes depositing a second dielectric layer over the patterned barrier layer and the top surface of the first dielectric layer, and planarizing the second dielectric layer to expose a top surface of the barrier structure.

In another embodiment, forming the barrier structure further includes encapsulating the patterned barrier layer with a hydrogen ($H_2$) barrier layer prior to depositing the second dielectric layer, and planarizing the second dielectric layer includes removing the $H_2$ barrier layer on the top surface of the barrier structure to expose the patterned barrier layer.

Optionally, patterning the barrier layer may include patterning the barrier layer to concurrently form a local interconnect (LI).

BRIEF DESCRIPTION OF THE DRAWINGS

Embodiments of the present invention will be understood more fully from the detailed description that follows and from the accompanying drawings and the appended claims provided below, where:

FIGS. 3A-3M are block diagrams illustrating cross-sectional views of a portion of an F-RAM cell during fabrication thereof according to the method of FIGS. 2A and 2B;

DETAILED DESCRIPTION

Embodiments of ferroelectric random access memories (F-RAM) including embedded or integrally formed ferroelectric capacitors and complementary metal-oxide-semiconductor (CMOS) transistors and methods of fabricating the same are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
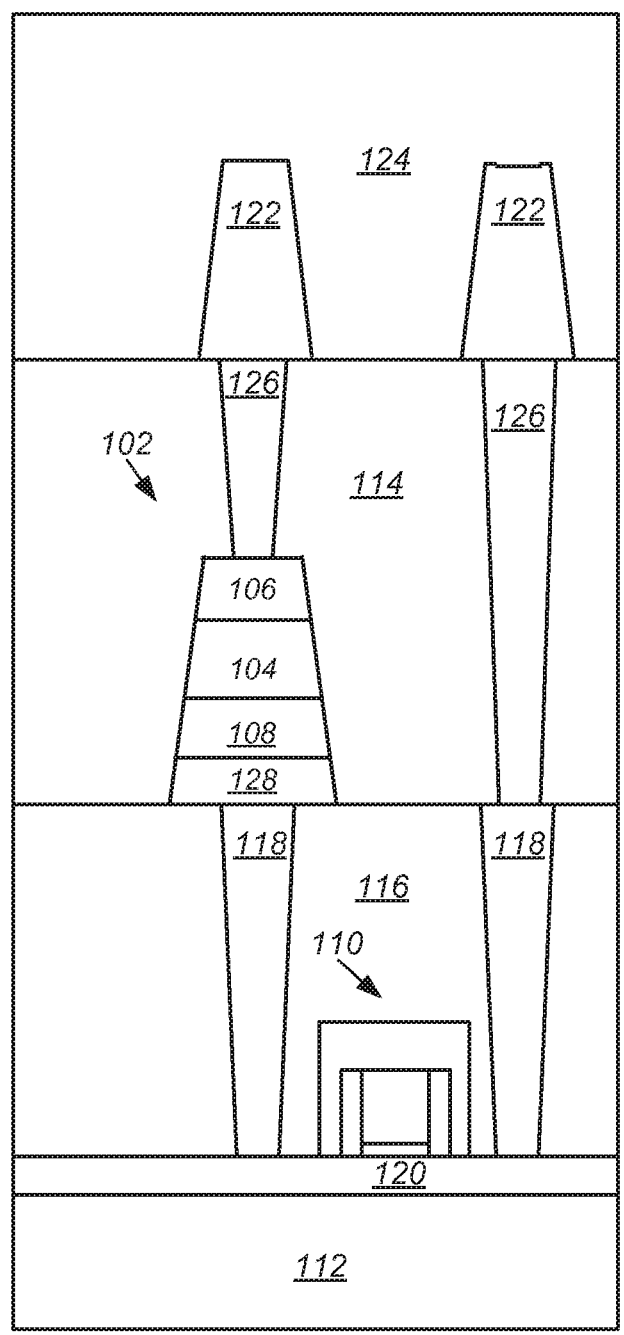
FIG. 1 (Prior Art) is a block diagram illustrating a cross-sectional views of a portion of a ferroelectric random access memory (F-RAM) cell fabricated according to a conventional method.
Figure 2A:
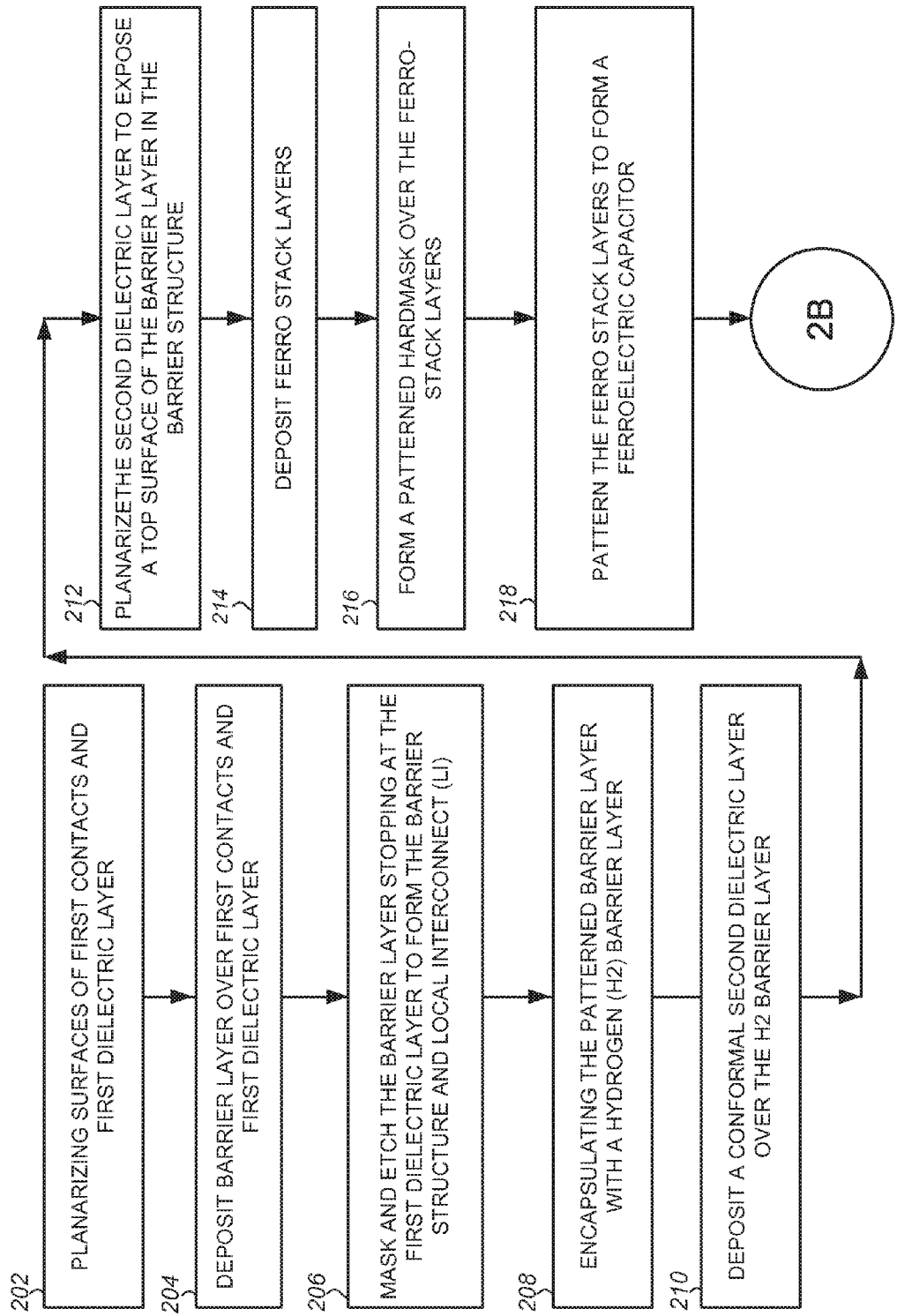
FIGS. 2A and 2B are a flowchart illustrating an embodiment of a method for fabricating a ferroelectric random access memory (F-RAM) including an embedded ferroelectric capacitor and metal-oxide-semiconductor (MOS) transistor.
Figure 2B:
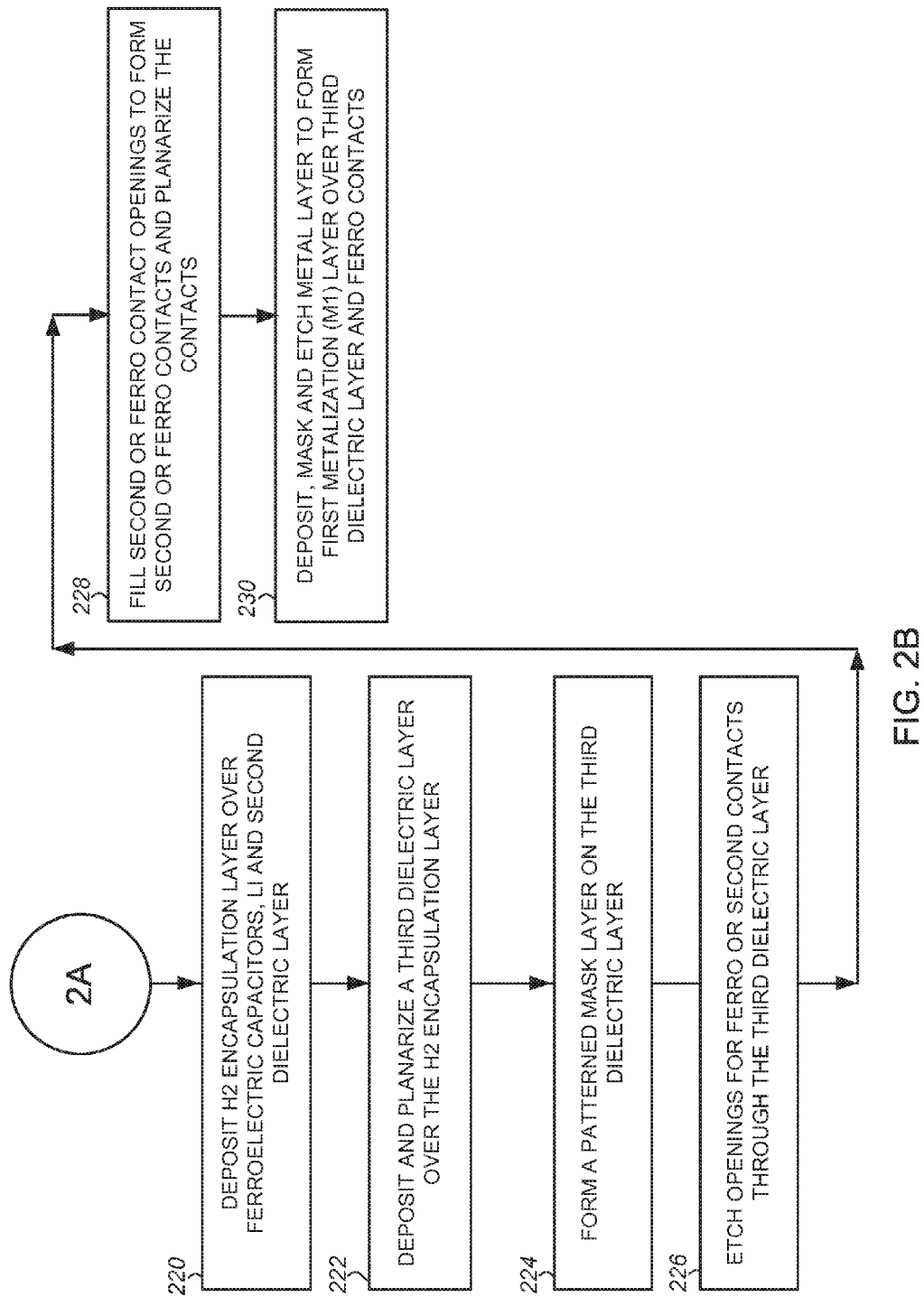

An embodiment of a method for integrating or embedding a ferroelectric capacitor into a standard or baseline CMOS process flow for fabricating an F-RAM will now be described in detail with reference to FIGS. 2A and 2B, and to FIGS. 3A-3N. FIGS. 2A and 2B are a flowchart illustrating an embodiment of a method for fabricating a ferroelectric random access memory (F-RAM) including an embedded ferroelectric capacitor and metal-oxide-semiconductor (MOS) transistor. FIGS. 3A-3M are block diagrams illustrating cross-sectional views of a portion of an F-RAM cell during fabrication thereof according to the method of FIGS. 2A and 2B. FIG. 3N is a block diagram illustrating cross-sectional views of a portion of a completed F-RAM cell including a ferroelectric capacitor fabricated according to the method of FIGS. 2A and 2B.

Referring to FIG. 2A and FIG. 3A, the process begins with planarizing surfaces of first contact plugs or contacts 302 and a first dielectric layer 304 or complementary metal-oxide-semiconductor (CMOS) layer after formation of a CMOS circuit on a surface 306 of a substrate 310, the CMOS circuit including one or more MOS transistors 312, separated by one or more isolation structures 314 the first dielectric layer overlying the MOS transistors and the first contacts extending through the first dielectric layer from a top surface 316 thereof to a diffusion region 318, such as a source or a drain, of a MOS transistor in the substrate (block 202).

In addition to a source and a drain, diffusion regions 318 can include a channel region (not shown in this figure). Generally, the substrate 310 and, hence, diffusion regions 318, may be composed of any material suitable for semiconductor device fabrication. In one embodiment, the substrate 310 is a bulk substrate composed of a single crystal of a material which may include, but is not limited to, silicon, germanium, silicon-germanium or an III-V compound semiconductor material. In another embodiment, the substrate 310 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. The top epitaxial layer is composed of a single crystal layer which may include, but is not limited to, silicon (i.e. to form a silicon-on-insulator (SOI) semiconductor substrate), germanium, silicon-germanium and an III-V compound semiconductor material.

The substrate 310 and, hence, the channel region, may include dopant impurity atoms. In a specific embodiment, channel region is doped P-type and, in an alternative embodiment, channel region is doped N-type. Source and drain diffusion regions 318 in the substrate 310 have opposite conductivity to channel region. For example, in one embodiment the substrate 310 and, hence, channel region, is composed of boron-doped single-crystal silicon having a boron concentration in the range of $1 \times 10^{15} – 1 \times 10^{19}$ atoms/cm$^3$. Source and drain diffusion regions 318 are composed of phosphorous- or arsenic-doped regions having a concentration of N-type dopants in the range of $5 \times 10^{16} – 5 \times 10^{19}$ atoms/cm$^3$. Generally, source and drain diffusion regions 318 have a depth in the substrate 310 in the range of 80-200 nanometers (nm). In accordance with an alternative embodiment of the present disclosure, source and drain diffusion regions 318 are P-type doped regions while the substrate 310 and channel region is an N-type doped region.

The MOS transistors 312 can include a gate oxide 322 formed on the surface 306 of the substrate 310, a gate layer 324 formed on gate oxide, and one or more sidewall spacers 326 isolating the gate layer from the first dielectric layer 304. Additionally, although not shown in this figure it will be understood by those skilled in the art that the gate layer 324 is generally electrically coupled to an overlying local interconnect (LI) or a metallization layer, such as a first metallization (M1) layer described in more detail below.

The first dielectric layer 304 can include a single layer of dielectric material or multiple layers of dielectric material as in the embodiment shown. For example, in one embodiment the first dielectric layer 304 includes a lower or bottom first dielectric layer 304a including phosphosilicate glass (PSG) formed or deposited by a chemical vapor deposition (CVD) process, such as plasma, low pressure or atmospheric CVD, and an upper or top first dielectric layer 304b including a silicon oxide, deposited by low pressure CVD (LPCVD) tool using tetraethyl-orthosilicate (TEOS) based process gas or precursors.

The first contacts 302 are formed by performing a contact etch to etch the first dielectric layer 304 exposing the underlying diffusion regions 318 followed by filling the openings formed with a conductive material, typically a refractory metal. The contact etch can be accomplished using standard photolithographic techniques and any suitable wet or dry etching chemistry for etching a silicon oxide and/or PSG. Suitable contact etch chemistries can include, for example, wet etching using hydrofluoric acid (HF), or gas phase etching (GPE) using a reactive ion etch (RIE) process gas including HF and methanol or methyl alcohol ($CH_3OH$). Contact openings formed in the first dielectric layer 304 are filled with the refractory metal. By refractory metals it is meant metals of elements of the groups 4, 5 and 6 of the periodic table, including titanium (Ti), tantalum (Ta), tungsten (W), and nitrides or alloys thereof, which are resistant to high temperatures. The refractory metal can be deposited, for example, by physical vapor deposition, such as sputtering or evaporation, or by CVD and electroless plating.

As indicated in step or block 202 of FIG. 2A, once formed the surfaces of the first contacts 302 and first dielectric layer 304 are planarized, for example, using a chemical mechanical polishing (CMP) process.

Next, a barrier structure (not shown in this figure) is formed over one or more of the contacts 302 over which a ferroelectric capacitor (not shown in this figure) will be formed. The barrier structure includes materials selected to form a barrier to moisture, lead, oxygen ($O_2$) an/or hydrogen ($H_2$) Referring to FIG. 2A and FIG. 3B forming the barrier structure begins with depositing or forming a barrier layer 328 over the planarized surfaces of the first contacts 302 and first dielectric layer 304 (block 204). Generally, the barrier layer includes a material selected to form an $O_2$ barrier layer 328. In one embodiment, not shown, the $O_2$ barrier layer 328 can include a single layer of a material, such as titanium-aluminum-nitride (TiAlN) having a thickness of from about 0.05 to about 0.5 μm deposited over the top surface of the first dielectric layer 304 and contacts 302.

In other embodiments, such as that shown, the $O_2$ barrier layer 328 can include multiple layers including a titanium nitride (TiN) first $O_2$ barrier layer 328a having a thickness of from about 0.03 to about 0.2 μm deposited over the top surface of the first dielectric layer 304 and contacts 302, and a titanium-aluminum-nitride (TiAlN) second $O_2$ barrier layer 328b having a thickness of from about 0.03 to about 0.10 μm deposited over the first $O_2$ barrier layer. Either or both of the first and second $O_2$ barrier layers 328 can be deposited or formed using any suitable deposition method, such as CVD, atomic layer deposition (ALD), or physical vapor deposition (PVD).

Referring to FIG. 2A and FIG. 3C, a mask (not shown) is formed over the $O_2$ barrier layer 328, and the $O_2$ barrier layer 328 etched to form a patterned $O_2$ barrier layer 328c as shown in FIG. 3C (block 206). Generally, the patterned $O_2$ barrier layer 328c includes a number of portions that form an $O_2$ barrier of a number of barrier structures 330 being formed over the contacts 302. Optionally, as in the embodiment shown, the patterned $O_2$ barrier layer 328c further includes a number of local interconnect (LI) 332 and landing pads 333. The LI 332 electrically connect devices on top of the first dielectric layer 304, through contacts 302 to devices formed in the CMOS or first dielectric layer, and/or devices formed above the layer on which the LI is formed through second or ferro contacts 356, as shown in FIG. 3N. Landing pads 333 cap some of the contacts 302 to the underlying diffusion regions 318 and serve as landing pads for additional contacts 356, as shown in FIG. 3N.

The mask used to form the patterned $O_2$ barrier layer 328c can include a hardmask or a photoresist mask, and the $O_2$ barrier layer 328 can be etched using standard photolithographic and etching techniques. For example, a TiN/TiAlN $O_2$ barrier layer can be dry etched using a mixture of a fluorine based gas, such as sulfur hexafluoride ($SF_6$), nitrogen trifluoride ($NF_3$) or tetrafluoromethane ($CF_4$), a chlorine based gas, such as chlorine ($Cl_2$) or Boron Trichloride ($BCl_3$), and, optionally, an argon gas to increase the etch rate by sputtering.

Next, referring to FIG. 2A and FIG. 3D forming the barrier structure further includes encapsulating the patterned $O_2$ barrier layer 328c with a hydrogen ($H_2$) barrier layer 334 (block 208). It has been observed that when a ferroelectric capacitor and/or devices or transistors in the underlying CMOS circuit are exposed to hydrogen introduced, for example, during subsequent processing the properties of the ferroelectric capacitor and/or transistors in the underlying CMOS circuit can be severely degraded. In some embodiments, such as that shown, the $H_2$ barrier layer 334 can include multiple layers including a first hydrogen barrier layer 334a of aluminum oxide ($Al_2O_3$) having a thickness of from about 100 to about 300 Å deposited over the patterned $O_2$ barrier layer 328c by ALD, and an upper or second hydrogen barrier layer 334b of silicon nitride ($Si_xN_y$) having a thickness of from about 0.02 to about 0.10 μm, and deposited by CVD or ALD.

Figure 3E:
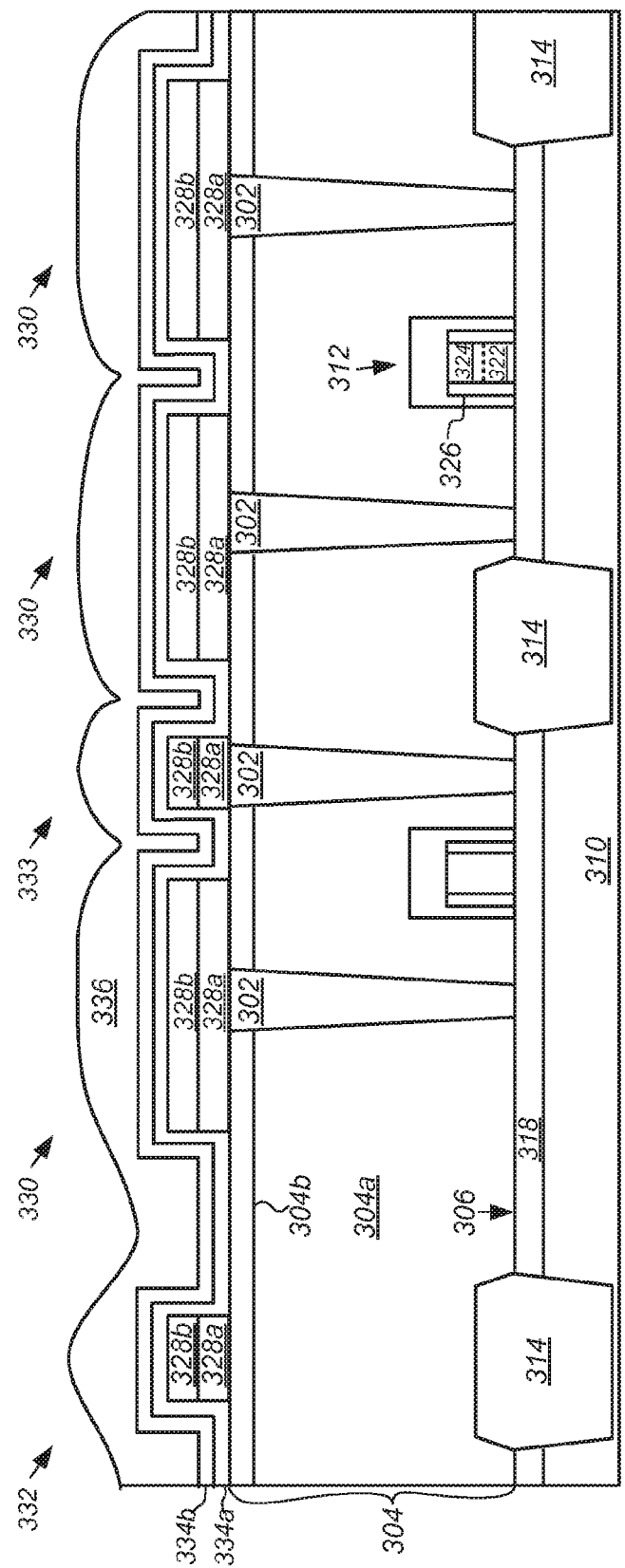

Referring to FIG. 2A and FIG. 3E, a conformal second dielectric layer 336 is deposited over the $H_2$ barrier layer 334 (block 210). Generally, as with the first dielectric layer 304, the second dielectric layer 336 can include one or more layers of a suitable dielectric material compatible with the material of the $H_2$ barrier layer 334 and materials used to fabricate the ferroelectric capacitor and second contacts (not shown in this figure). Suitable dielectric material can include phosphosilicate glass (PSG) and a silicon oxide. For example, in the embodiment shown the second dielectric layer 336 includes a single layer of silicon oxide deposited by a CVD process, such as plasma, low pressure or atmospheric CVD using tetraethyl-orthosilicate (TEOS) based process gas or precursors to a sufficient for a chemical mechanical polishing (CMP) process.

Figure 3F:
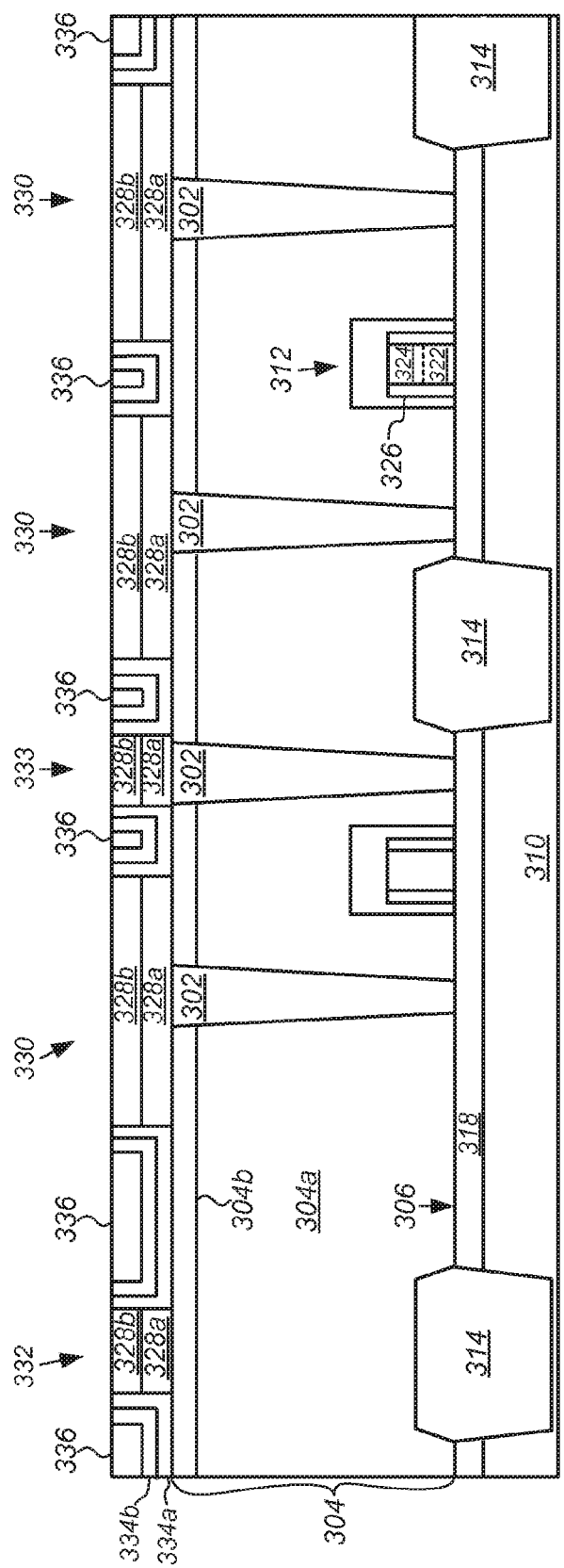

Next, referring to FIG. 2A and FIG. 3F, the second dielectric layer 336 is polished or planarized, for example, using a CMP process to expose a top surface of the 02 barrier in the barrier structures 330 (block 212). That is planarizing the second dielectric layer 336 comprises removing the $H_2$ barrier layer 334 on a top surface of the barrier structure 330 to expose the second $O_2$ barrier layer 328b. It will be understood that as in the embodiment shown, in those embodiments in which patterning O$_2$ barrier layer 328 (block 206) further includes patterning O$_2$ barrier layer to form a number of local interconnect (LI) 332 planarizing the second dielectric layer 336 may also include removing the H$_2$ barrier layer(s) 334 on a top surface of the LI 332 to expose the second O$_2$ barrier layer 328b.

Figure 3G:
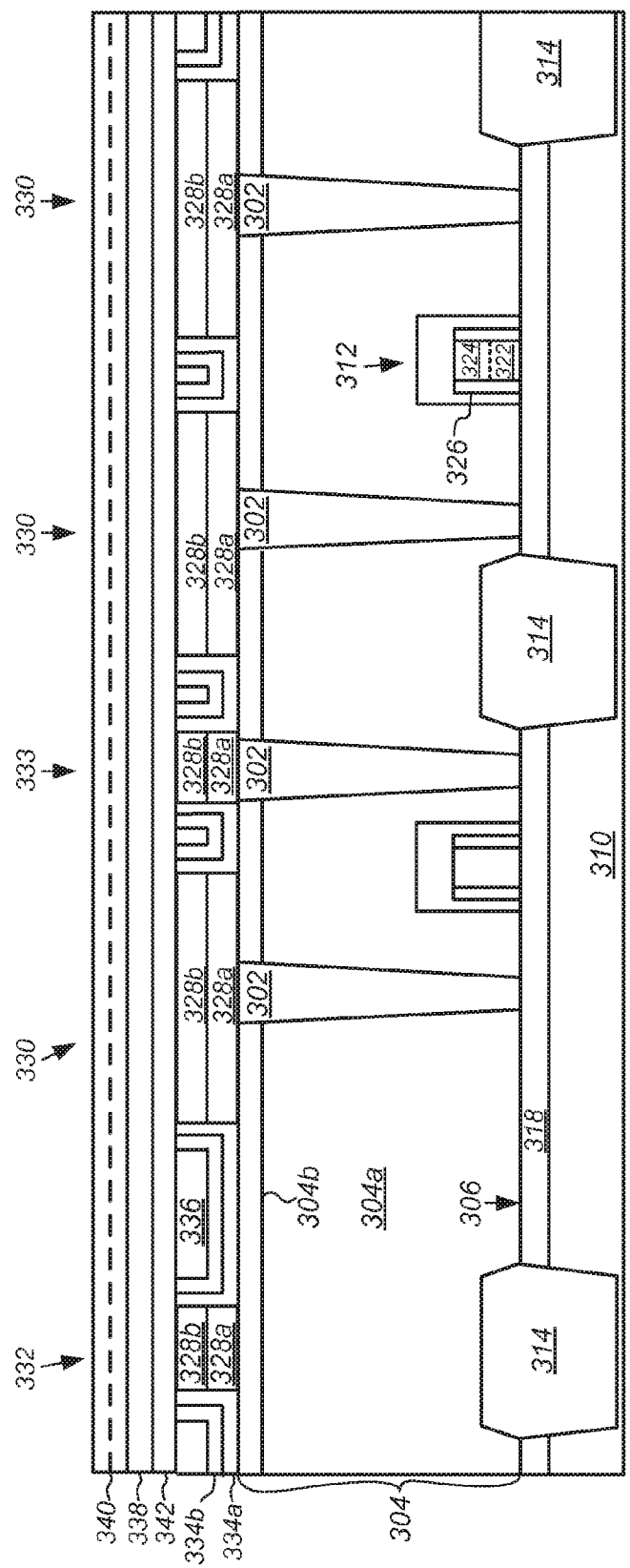

Referring to FIG. 2A and FIG. 3G layers of a ferro stack from which a ferroelectric capacitor will be formed are deposited or formed over the planarized surfaces of the second dielectric layer 336, the preformed or pre-patterned, barrier structures 330 and the LI 332 (block 214). Generally, the ferro stack layers includes a layer of a ferroelectric material, such as a lead zirconate titanate (PZT) ferroelectric layer 338, between a top electrode 340 and bottom electrode 342 in electrical contact with or electrically coupled to one of the underlying first contacts 302 through the electrically conductive material of the O$_2$ barrier 328 of the barrier structure 330, and through the contact to the diffusion region 318 of the MOS transistor 312.

The top and the bottom electrodes 340, 342, can include one or more layers of iridium or iridium oxide having a thickness of from about 0.05 to about 0.20 μm, and deposited or formed using CVD, ALD or PVD. In the embodiment shown the top electrode 340 is a multi-layer top electrode including, for example, a lower layer of iridium oxide (IrO2) in contact with the PZT ferroelectric layer 338 and an upper layer of iridium (Ir) overlying the lower layer of the top electrode. The PZT ferroelectric layer 338 is deposited on the bottom electrode 342 to a thickness of from about 0.04 to about 0.10 μm, using CVD, ALD or PVD.

Figure 3H:
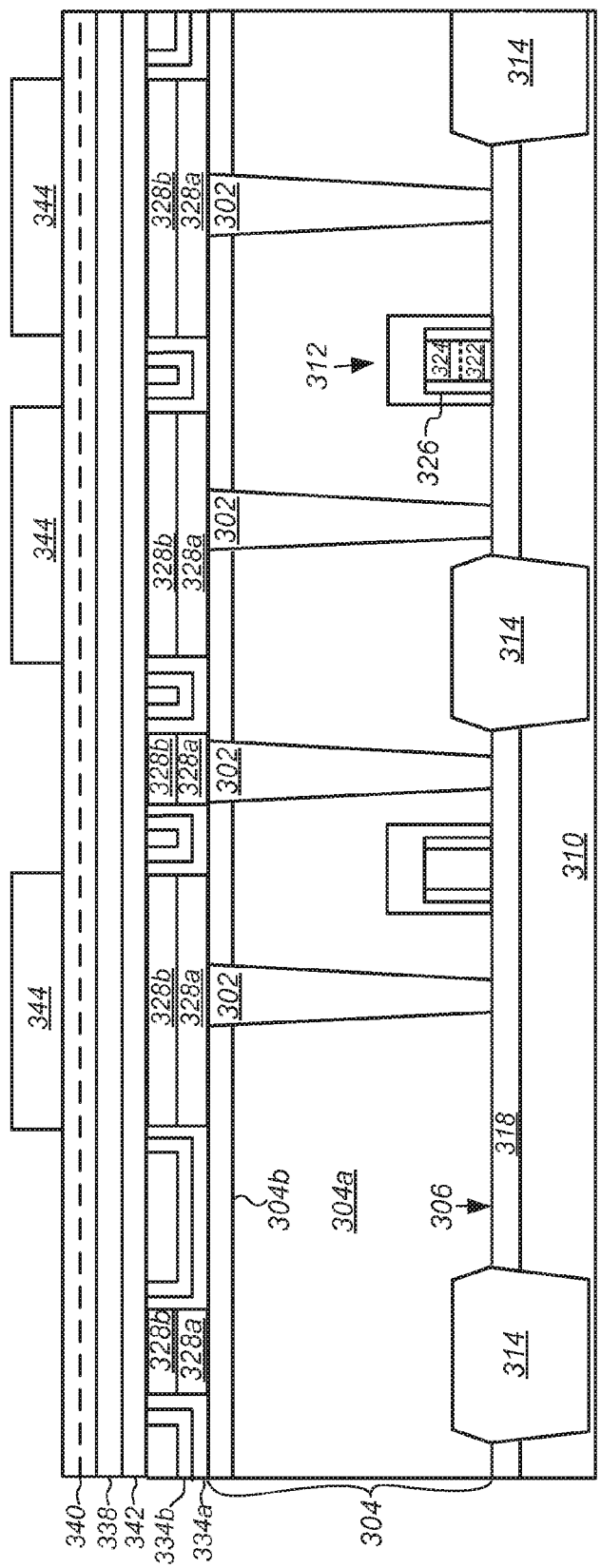

Referring to FIG. 2A and FIG. 3H a patterned hardmask 344 is formed over the ferro-stack layers 338, 340, 342, using standard photolithographic and etching technologies (block 216). In certain embodiments, the hardmask 344 can include multiple layers and the material of the hardmask is selected to form a barrier, such as a hydrogen (H$_2$) barrier, that is left on the ferro-stack layers after etching to form a ferroelectric capacitor (not shown). The hardmask 344 can include, for example, a layer of titanium aluminum nitride (TiAlN) having a thickness of from about 0.15 to about 0.20 μm, and deposited or formed using a PVD process. Suitable chemistries and techniques for etching the hardmask 344 can include using a mixture of a fluorine based gas, such as sulfur hexafluoride (SF$_6$), nitrogen trifluoride (NF$_3$) or tetrafluoromethane (CF$_4$), a chlorine based gas, such as chlorine (Cl$_2$) or Boron Trichloride (BCl$_3$), and, optionally, an argon gas to increase the etch rate by sputtering.

Figure 3I:
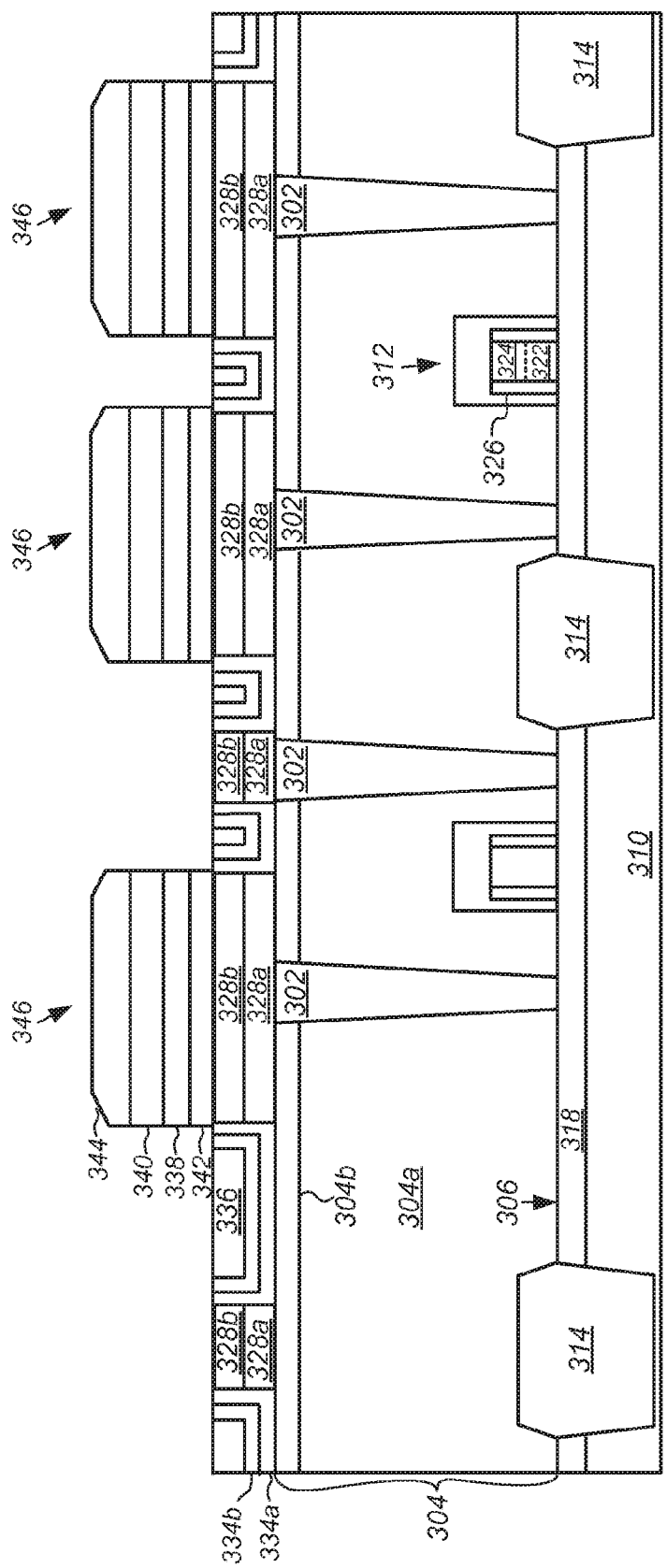

Next, referring to FIG. 2A and FIG. 3I the ferro stack layers 338, 340, 342, are patterned using the patterned hardmask 344 and standard etching technologies to form a ferroelectric capacitor 346 over the previously fabricated barrier structure 330 (block 218). Suitable chemistries and techniques for etching the ferro stack layers can include standard metal etch chemistries, including for example, high density plasma (HDP) etching, and various post-metal etch cleaning processes to prevent corrosion defects. It will be understood that a significant advantage of the method of the present disclosure is that because the ferroelectric capacitor 346 is formed over the pre-patterned barrier structure 330 is that conductive residues formed during etching or patterning of layers to form the barrier structure, are not re-deposited on sidewalls of the ferroelectric capacitor, as would happen if the barrier structure 330 were formed after etching of the ferro stack layers 338, 340, 342. Conductive residues on sidewalls of the ferroelectric capacitor 346 forming a high leakage path between bottom electrode 342 and top electrode 340 impairing operation of the ferroelectric capacitor, or, when the conductive residues are excessive, shorting the bottom electrode and top electrode rendering the ferroelectric capacitor completely inoperative. In one embodiment, the length of ferroelectric capacitor 346 may be configured correspondingly to the length of pre-patterned barrier structure 330 by adjusting the dimension of patterned hardmask 344.

Figure 3J:
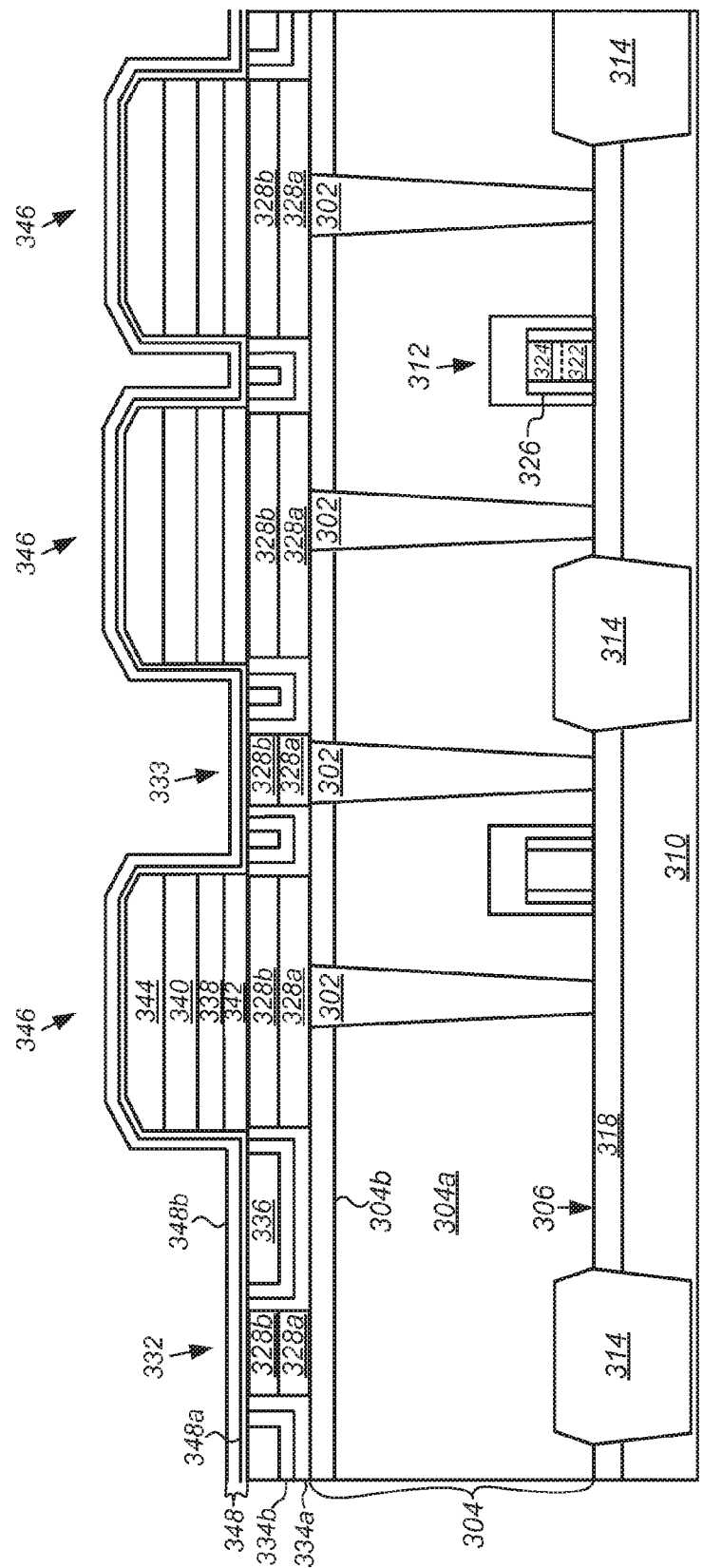

Referring to FIG. 2B and FIG. 3J, a second H$_2$ barrier or H$_2$ encapsulation layer 348 is deposited over a top and sidewalls of the ferroelectric capacitor 346 and over the surface the LI 332, any exposed surface of the second dielectric layer 336, substantially encapsulating the ferroelectric capacitor (block 220). It has been observed that when the ferroelectric capacitor 346 is exposed to hydrogen introduced, for example during subsequent processing, the properties of the ferroelectric capacitor can be severely degraded. The second H$_2$ encapsulation layer 348 can include a single material layer, or multiple material layers. In one embodiment, such as that shown, second H$_2$ encapsulation layer 348 can include a lower or first hydrogen encapsulation layer 348a of aluminum oxide (Al$_2$O$_3$) having a thickness of from about 100 to about 300 Å, and deposited by ALD, and an upper or second hydrogen encapsulation layer 348b of silicon nitride (Si$_x$N$_y$), having a thickness of from about 0.02 to about 0.10 μm, and deposited by CVD or ALD.

Figure 3K:
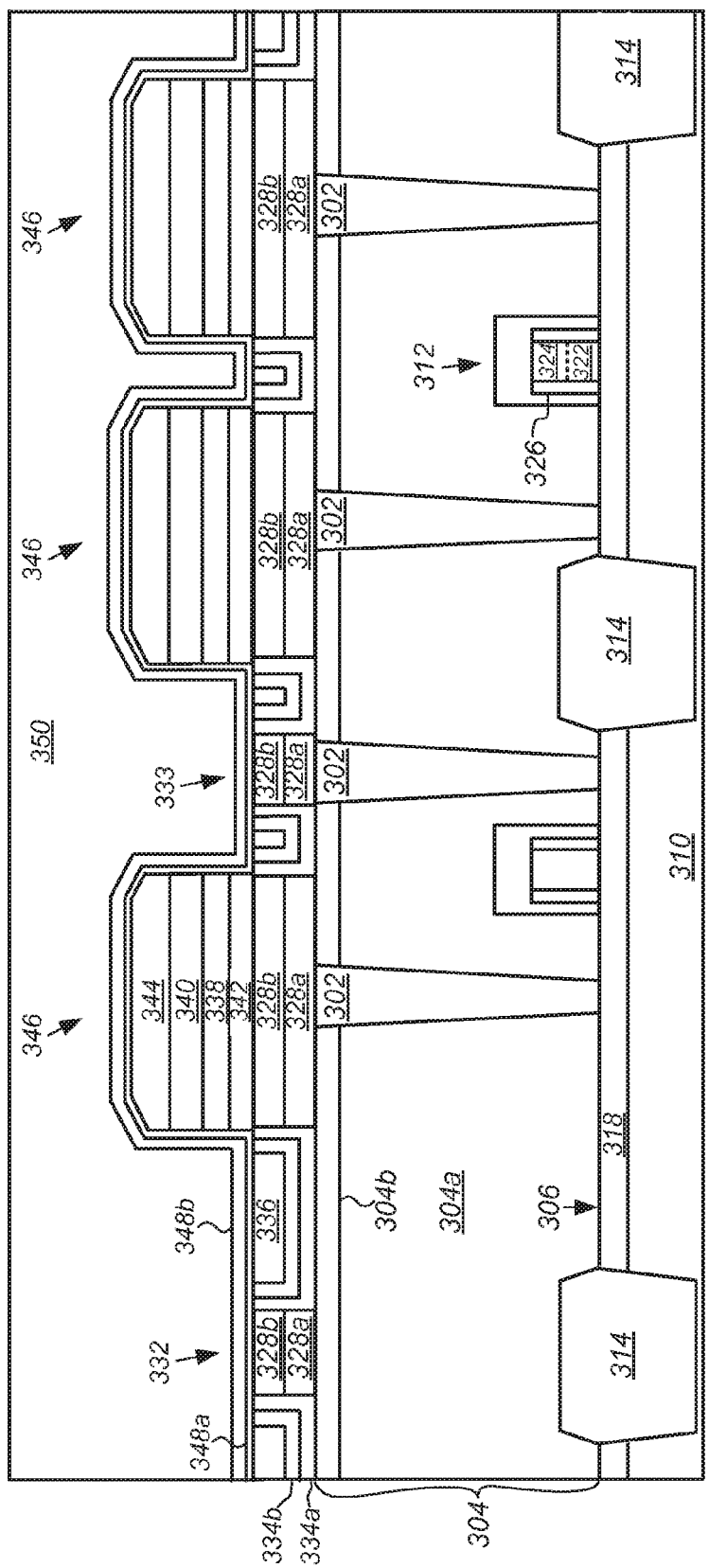

Referring to FIG. 2B and FIG. 3K, a third dielectric layer 350 or ILD is deposited or formed over the H$_2$ encapsulation layer 348 and planarized (block 222). The third dielectric layer 350 can include one or more layers of an undoped oxide, such as silicon-dioxide (SiO$_2$), a nitride, such as silicon nitride (Si$_x$N$_y$), a silicon-oxynitride (Si$_x$O$_y$N$_z$) or, as with the first dielectric layer 304 described above an oxide, such as phosphosilicate glass (PSG). For example, in one embodiment the third dielectric layer 350 can include a SiO$_2$ having a final, post CMP thickness of from about 0.1 to about 0.3 μm from the top of the H$_2$ encapsulation layer 348, by deposited by LPCVD using TEOS.

Figure 3L:
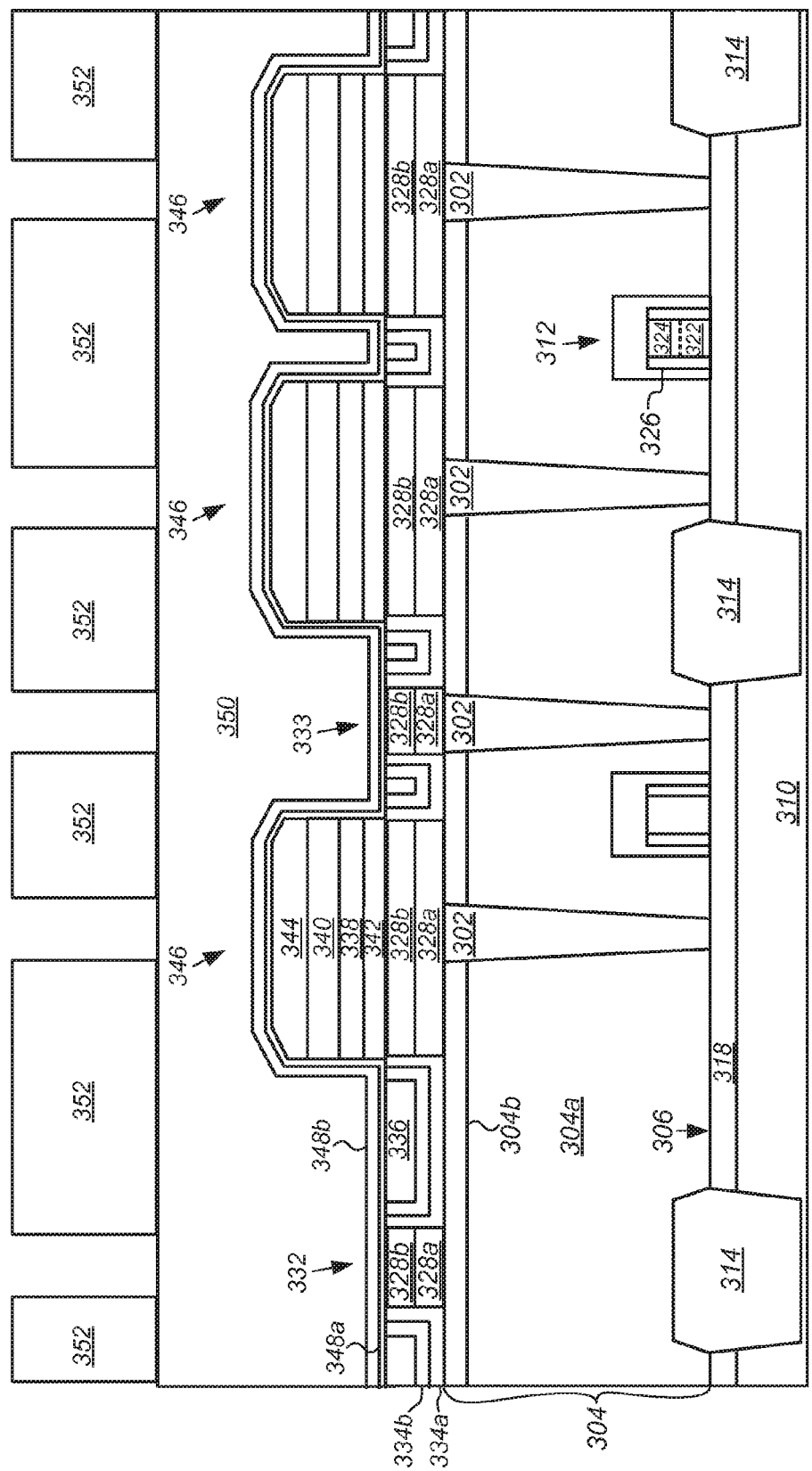
Figure 3M:
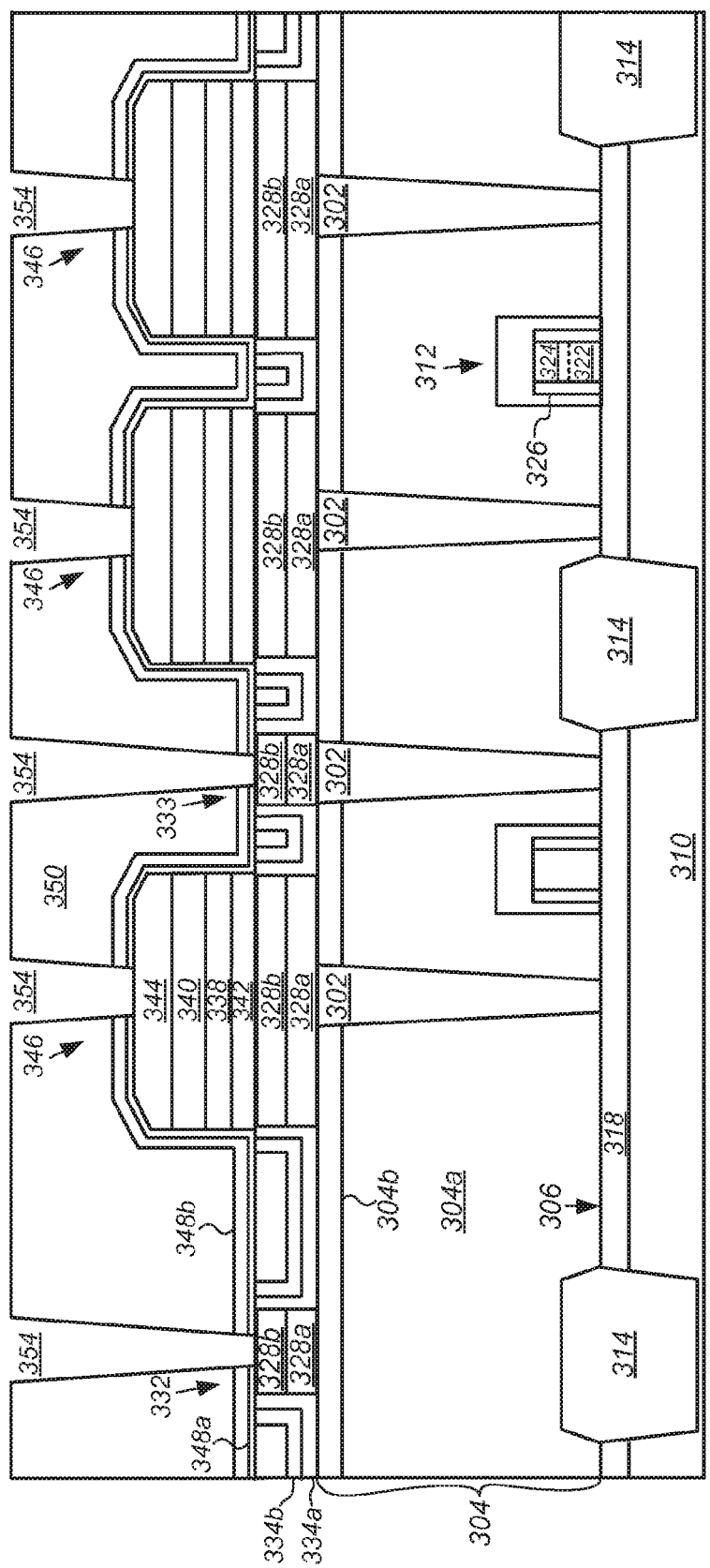
Figure 3N:
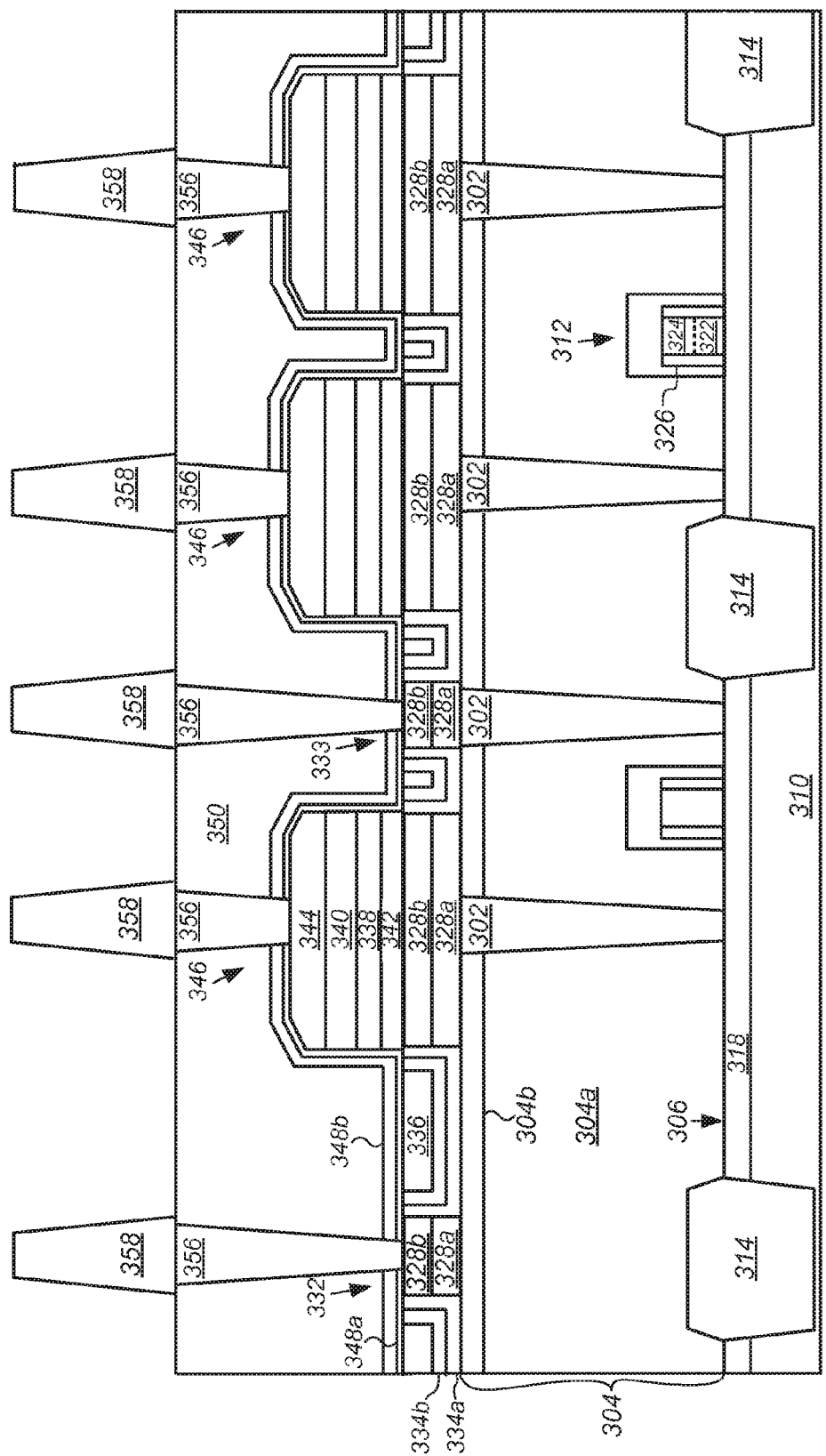
FIG. 3N is a block diagram illustrating a cross-sectional views of a portion of a portion of an F-RAM cell fabricated according to the method of FIGS. 2A and 2B.

Next, referring to FIG. 2B and FIG. 3L a patterned mask layer 352 is formed on the third dielectric layer 350 (block 224), and, referring to FIG. 2B and FIG. 3M openings 354 are etched through third dielectric layer 350 for ferro or second contacts (not shown) to electrically couple, through the hardmask 344, to the top electrode 340 of the ferroelectric capacitor 346, and to LI 332 using standard photolithographic and etching technologies (block 226). For an SiO$_2$ third dielectric layer 350 suitable masking and etching techniques can include forming a patterned photoresist layer, and etching the third dielectric layer with an etch chemistry comprising carbon-monoxide (CO), argon (Ar), octafluorocyclobutane (C$_4$F$_8$) or Freon® 318, and, optionally, nitrogen (N$_2$).

Referring to FIG. 2B and FIG. 3N, a ferro contact openings 354 are filled to form second or ferro contacts 356 (block 228). As with the first contacts 302 described above, the ferro contacts 356 are formed by filling the contact openings with a refractory metal, such as titanium (Ti), tantalum (Ta), tungsten (W), and nitrides or alloys thereof, by physical vapor deposition, such as sputtering, evaporation or CVD. After filling the second contact openings the contacts 356 and third dielectric layer 350 are planarized using, for example, a CMP process. FIG. 3N is a block diagram illustrating a cross-sectional view of a substantially completed portion of an F-RAM cell including a ferroelectric capacitor 346, and fabricated according to the method of FIGS. 2A and 2B.

Next, referring to FIG. 2B and again to FIG. 3N a metal layer is deposited over the third dielectric layer 350 and masked and etched to form a first metallization (M1) layer 358 (block 230). Generally, the metal layer can be or include aluminum, copper or alloys or mixtures thereof, and is deposited by PVD, such as sputtering, evaporation, or electroless plating to a thickness of from about 1000 to about 5000 Å. The metal layer is patterned to form the M1 layer 358 using standard photolithographic and metal etching techniques, including for example, high density plasma (HDP) etching, and various post-metal etch cleaning processes to prevent corrosion defects.

It will be understood by those skilled in the art that the embodiment of a method of manufacturing or fabricating an F-RAM cell including embedded or integrally formed ferroelectric capacitor and CMOS transistors described above advantageously minimizes changes to the standard complimentary metal-oxide-semiconductor (CMOS) process flow, including the addition of just two additional mask steps, thereby reducing cost of fabricating ferroelectric random access memories (F-RAM).

It will be further understood that a number of layers in the completed ferroelectric capacitor 346 is reduced by at least one layer, i.e., a $O_2$ barrier that is typically formed and patterned with the ferro stack layers formed in a conventional method, and a stack height of the ferroelectric capacitor is reduced by about 30% over, those formed by the conventional method. In addition, the challenge of etching the ferro stack layers 338, 340, 342 is reduced due to the change in aspect ratio, enabling the sidewalls of the ferroelectric capacitor 346 to be more vertical, and providing a larger cap size (top surface of the ferroelectric capacitor) for the same design layout. In addition to the above, the thinner third dielectric layer 350 enables a lower aspect ratio for the second or ferro contacts 356, facilitating contact etch and fill, and increasing a yield of working devices. Finally, it is noted that by forming the LI 332 and landing pads 333 from the patterned $O_2$ barrier layer 328c substantially eliminates the potential for oxidizing metal used in the underlying first contacts 302 during subsequent processing.

Figure 4:
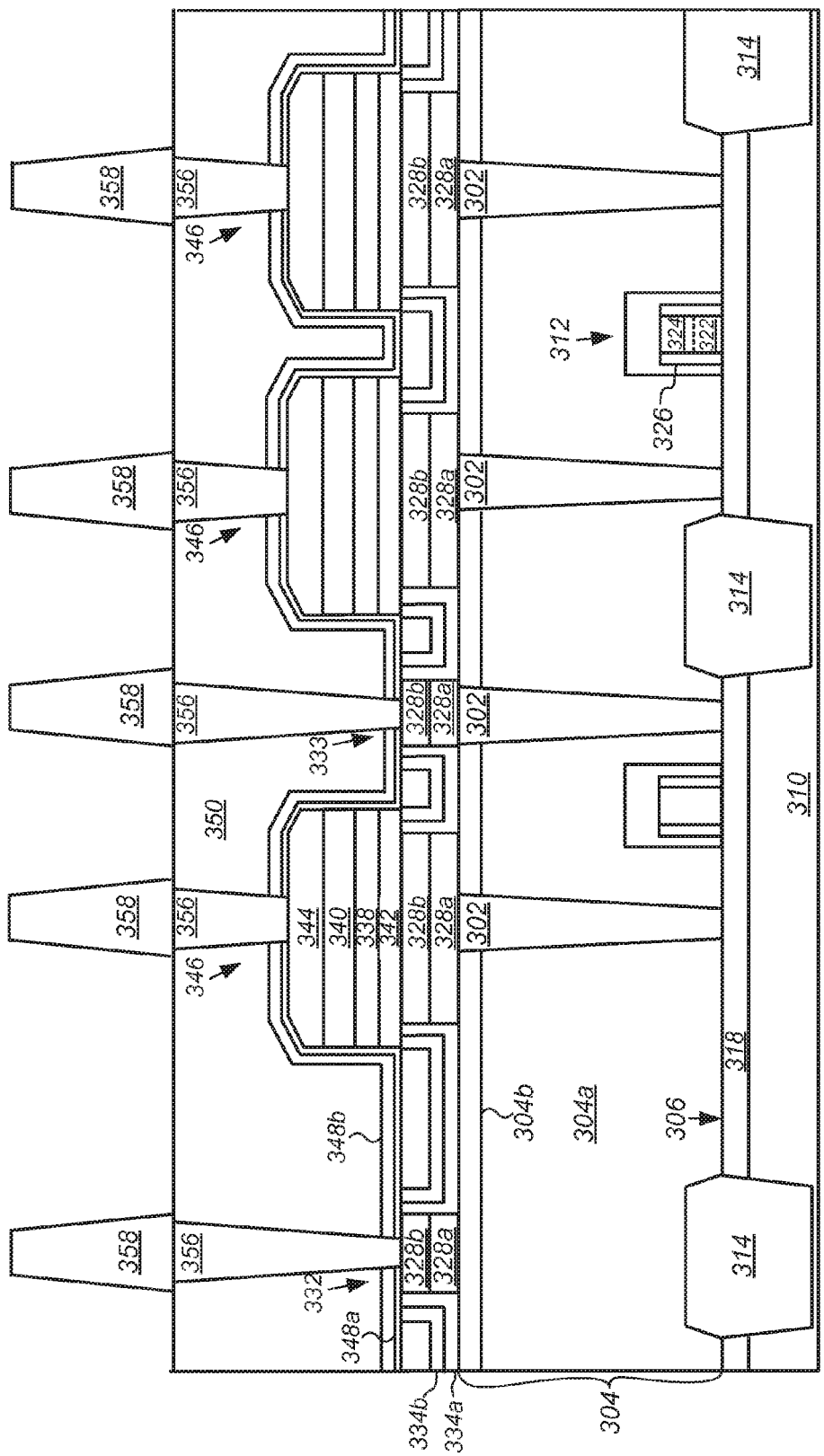
FIG. 4 is a block diagram illustrating a cross-sectional view of a portion of an F-RAM cell fabricated according to another embodiment of the method of FIGS. 2A and 2B, improve the misalignment tolerance.

FIG. 4 is a block diagram illustrating a cross-sectional view of a portion of a completed F-RAM fabricated according to an alternate embodiment of the method of FIGS. 2A-2B and 3A-N. Referring to FIG. 4, in this embodiment the patterning the ferro-stack to form the ferroelectric capacitor 346 over the previously fabricated barrier structure 330, block 218, comprises patterning the ferro-stack to form a bottom electrode 342 having a larger area in a plane parallel to the surface 306 of the substrate 310 than an area of the barrier structure 330. It will be understood by those skilled in the art that this embodiment wherein the barrier structure 330 has a smaller dimension compared to bottom electrode 342 of the ferroelectric capacitor 346 will improve the misalignment tolerance, thereby facilitating the fabrication processes and increasing a yield of the working devices.

Figure 5:
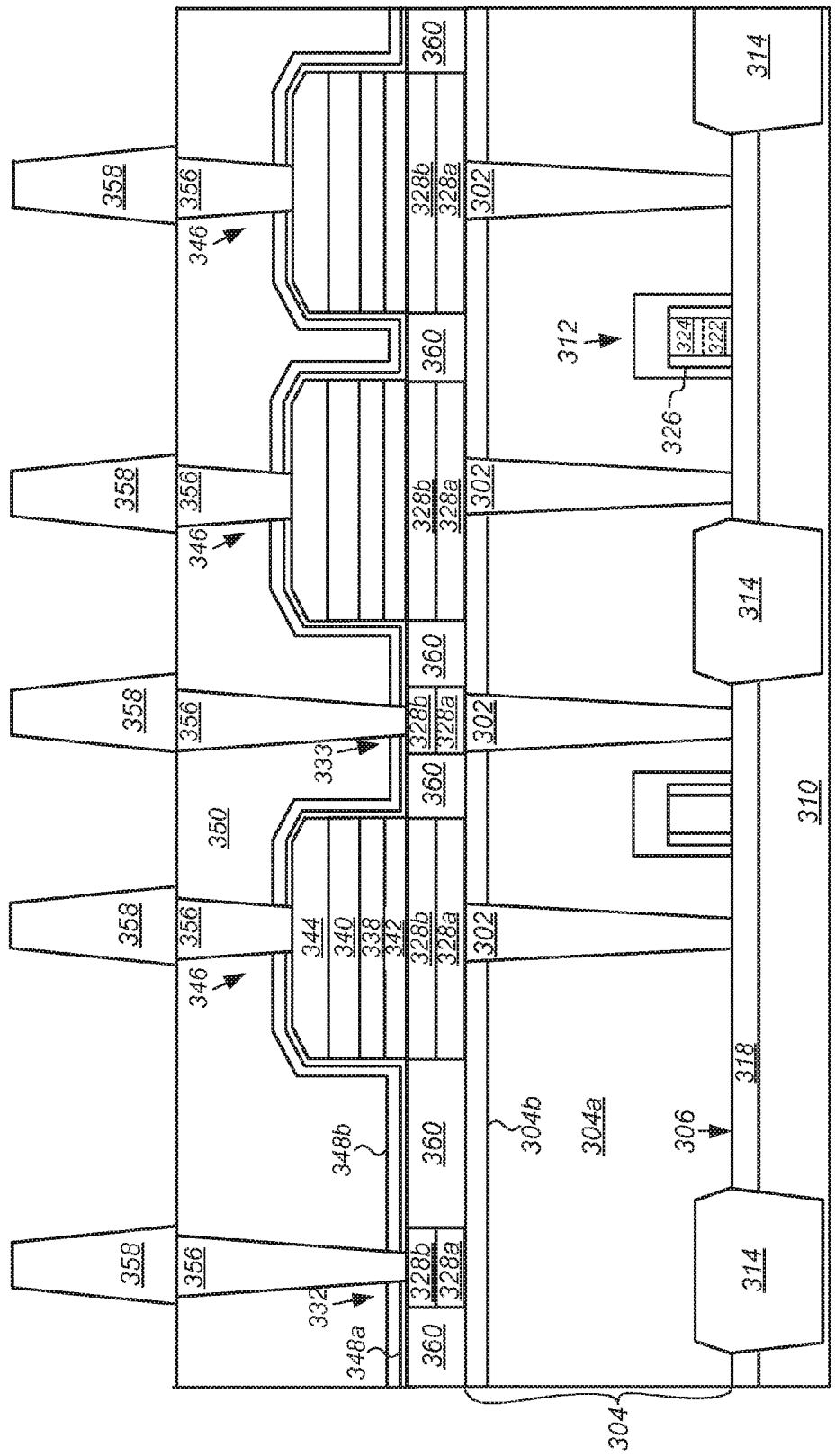
FIG. 5 is a block diagram illustrating a cross-sectional view of a portion of an F-RAM cell fabricated according to yet another embodiment of the method of FIGS. 2A and 2B.

FIG. 5 is a block diagram illustrating a cross-sectional view of a portion of a completed F-RAM fabricated according to another alternate embodiment of the method of FIGS. 2A-2B and 3A-N. Referring to FIG. 5, in this embodiment the hydrogen barrier layer(s) 334a, 334b, are omitted or replaced by the substitution of a silicon nitride ($Si_3N_4$) layer 360 for the $SiO_2$ of the second dielectric layer 336. Silicon nitride layer 360 can be deposited by CVD or ALD over patterned $O_2$ barrier layer 328c (shown in FIG. 3C) and planarized, for example, using a CMP process such as that described in relation to block 212 in relation to FIGS. 3E and 3F.

Thus, embodiments of ferroelectric random access memories including embedded or integrally formed F-RAM capacitors and CMOS transistors and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory device, comprising:
   a barrier layer disposed over a contact and a first dielectric, the barrier layer comprising a pre-patterned barrier structure that is electrically conductive, wherein the pre-patterned barrier structure is formed by a first patterning, disposed over the contact and includes a first length, wherein the barrier layer further comprises at least one first hydrogen barrier structure disposed besides the pre-patterned barrier structure, wherein the at least one first hydrogen barrier structure is in contact with at least one sidewall of the pre-patterned barrier structure; and
   a patterned ferro-stack including a second length disposed at least partially over the pre-patterned barrier structure, wherein the patterned ferro-stack is formed by a second patterning and coupled electrically to the contact via the pre-patterned barrier structure.

2. The memory device of claim 1, wherein the second length is configurable correspondingly to the first length and is configured to be larger than the first length.

3. The memory device of claim 1, wherein the second length is configurable correspondingly to the first length and is configured to be the same as the first length.

4. The memory device of claim 1, wherein the barrier layer further comprises at least one local connection (LI), the at least one LI comprising a similar structure to the pre-patterned barrier structure.

5. The memory device of claim 4, wherein the at least one LI and the pre-patterned barrier structure are disposed side by side, each of the at least one LI and the pre-patterned barrier structure further includes a first oxygen barrier layer disposed over the contact or the first dielectric and a second oxygen barrier layer disposed over the first oxygen barrier layer.

6. The memory device of claim 5, wherein the first oxygen barrier layer includes titanium nitride and the second oxygen barrier layer includes titanium-aluminum-nitride (TiAlN).

7. The memory device of claim 1, wherein the first patterning of the pre-patterned barrier structure and the second patterning of the patterned ferro-stack are performed separately.

8. The memory device of claim 1, wherein the at least one first hydrogen barrier structure each comprises a first hydrogen barrier layer disposed over the contact or the first dielectric, and in contact with the at least one side wall of the pre-patterned barrier structure, and a second hydrogen barrier layer disposed over the first hydrogen barrier layer, wherein the first hydrogen barrier layer includes aluminum oxide ($Al_2O_3$) and the second hydrogen barrier layer includes silicon nitride.

9. The memory device of claim 1, wherein the pre-patterned barrier structure comprises material selected to form a barrier to moisture, lead, oxygen or hydrogen.

10. A memory device, comprising:
at least one contact that extending through a first dielectric layer to a surface of a substrate;
a barrier layer including a planarized top surface disposed over the at least one contact and the first dielectric, wherein the barrier layer comprises:
a plurality of oxygen barrier structures, and
a plurality of first hydrogen barrier structures;
a ferroelectric capacitor disposed over each of the plurality of oxygen barrier structures, wherein the ferroelectric capacitor is connected electrically to the at least one contact via the plurality of oxygen barrier structures; and
a second hydrogen barrier structure disposed to encapsulate a top surface and two sidewalls of the ferroelectric capacitor.

11. The memory device of claim 10, wherein the barrier layer further comprises:
a plurality of local interconnects (LI), each including a similar structure to the plurality of oxygen barrier structures, without the ferroelectric capacitor being disposed thereon, wherein the plurality of LI are disposed besides the plurality of first hydrogen barrier structures.

12. The memory device of claim 10, wherein each of the plurality of oxygen barrier structures comprises a second oxygen barrier layer disposed over a first oxygen barrier layer, and wherein the first oxygen barrier layer includes titanium nitride and the second oxygen barrier layer includes titanium-aluminum-nitride (TiAlN).

13. The memory device of claim 10, wherein each of the plurality of first hydrogen barrier structures is multi-layer comprising a second hydrogen barrier layer disposed over a first hydrogen barrier layer and a core dielectric encapsulated by the second hydrogen barrier layer, wherein the plurality of oxygen barrier structures and the plurality of first hydrogen structures are disposed beside one another and each of the first hydrogen barrier layer is in contact with at least one sidewall of one of the plurality of oxygen barrier structures.

14. The memory device of claim 13, wherein:
the first hydrogen barrier layer includes aluminum oxide ($Al_2O_3$);
the second hydrogen barrier layer includes silicon nitride; and
the core dielectric includes phosphosilicate glass (PSG) or silicon dioxide.

15. The memory device of claim 10, wherein each of the plurality of first hydrogen barrier structures is single-layer including silicon nitride.

16. A memory device, comprising:
a first dielectric disposed over a substrate;
a contact extending through the first dielectric to the substrate;
a multi-layer oxygen barrier structure disposed over a top surface of the contact;
a first hydrogen barrier structure disposed on both sides of the multi-layer oxygen barrier structure, wherein the multi-layer oxygen barrier structure and the first hydrogen barrier structure include a common planarized top surface;
a ferro-stack disposed over the common planarized top surface; and
a second hydrogen barrier structure disposed over the ferro-stack and the common planarized top surface, wherein the second hydrogen barrier structure encapsulates the ferro-stack.

17. The memory device of claim 16, wherein the ferro-stack includes a larger area than the multi-layer oxygen barrier structure.

18. The memory device of claim 16, wherein the ferro-stack includes:
a bottom electrode disposed over and in contact with the multi-layer oxygen barrier structure;
a ferroelectric layer disposed over the bottom electrode; and
a top electrode disposed over the ferroelectric layer.

19. The memory device of claim 16, wherein the multi-layer oxygen barrier structure includes a second oxygen barrier layer disposed over a first oxygen barrier layer, wherein the first oxygen barrier layer includes titanium nitride and the second oxygen barrier layer includes titanium-aluminum-nitride (TiAlN).

20. The memory device of claim 16, wherein the first hydrogen barrier structure is different from the second hydrogen barrier structure.

* * * * *